United States Patent
Martin et al.

(10) Patent No.: US 12,397,435 B2
(45) Date of Patent: Aug. 26, 2025

(54) SUBSTRATE LOCATION DETECTION AND ADJUSTMENT

(71) Applicant: Lam Research Corporation, Fremont, CA (US)

(72) Inventors: Michael John Martin, Union City, CA (US); Yuhou Wang, Fremont, CA (US); Alexander Miller Paterson, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 988 days.

(21) Appl. No.: 17/427,522

(22) PCT Filed: Feb. 6, 2020

(86) PCT No.: PCT/US2020/017080
§ 371 (c)(1),
(2) Date: Jul. 30, 2021

(87) PCT Pub. No.: WO2020/163644
PCT Pub. Date: Aug. 13, 2020

(65) Prior Publication Data
US 2022/0126454 A1 Apr. 28, 2022

Related U.S. Application Data

(60) Provisional application No. 62/802,932, filed on Feb. 8, 2019.

(51) Int. Cl.
*B25J 9/16* (2006.01)
*B25J 11/00* (2006.01)
(Continued)

(52) U.S. Cl.
CPC ......... *B25J 9/1697* (2013.01); *B25J 11/0095* (2013.01); *B25J 13/08* (2013.01);
(Continued)

(58) Field of Classification Search
CPC ...... B25J 9/1697; B25J 11/0095; B25J 13/08; H01J 37/32733; H01J 2237/206;
(Continued)

(56) References Cited

U.S. PATENT DOCUMENTS 6,760,976 B1 * 7/2004 Martinson ......... H01L 21/67265
414/936
9,405,287 B1 * 8/2016 Ravid .................. G05B 19/402
(Continued)

FOREIGN PATENT DOCUMENTS

CN 104756243 A * 7/2015 ........... G01B 11/002
CN 107112264 8/2017
(Continued)

OTHER PUBLICATIONS

"Singapore Application Serial No. 11202108483Y, Response filed Sep. 12, 2023 to Written Opinion mailed Apr. 12, 2022", w English claims, 16 pgs.
(Continued)

*Primary Examiner* — Jacob S. Scott
*Assistant Examiner* — Erin Morris
(74) *Attorney, Agent, or Firm* — Schwegman Lundberg & Woessner, P.A.

(57) ABSTRACT

Systems and methods are provided for positioning a wafer in relation to a datum structure. In one example, a system comprises a camera arrangement including at least two cameras, each of the at least two cameras including a field of view when positioned in the camera arrangement, each field of view including a peripheral edge of the wafer and a peripheral edge of the datum structure. A processor receives positional data from each of the at least two cameras and determines, in relation to each field of view, a gap size between the respective peripheral edges of the wafer and the datum location included in the respective field of view. A
(Continued)

controller adjusts a position of the wafer relative to the datum structure based on the determined respective gap sizes.

22 Claims, 12 Drawing Sheets

(51) Int. Cl.
    *B25J 13/08*           (2006.01)
    *H01J 37/32*           (2006.01)
    *H01L 21/68*           (2006.01)
    *H01L 21/683*         (2006.01)
    *H01L 21/687*         (2006.01)

(52) U.S. Cl.
    CPC ...... *H01J 37/32733* (2013.01); *H01L 21/681* (2013.01); *H01J 2237/206* (2013.01); *H01J 2237/334* (2013.01); *H01L 21/6831* (2013.01); *H01L 21/68707* (2013.01); *H01L 21/68721* (2013.01)

(58) Field of Classification Search
    CPC ........... H01J 2237/334; H01J 37/32935; H01J 37/3299; H01J 37/32642; H01L 21/681; H01L 21/6831; H01L 21/68707; H01L 21/68721; H01L 21/67259; H01L 21/67069; G01B 11/14; G01B 11/02
    See application file for complete search history.

(56) References Cited

U.S. PATENT DOCUMENTS

| | | | |
|---|---|---|---|
| 2008/0101912 A1* | 5/2008 | Martin | H01L 21/67196 414/935 |
| 2008/0232672 A1* | 9/2008 | Birkner | G01N 21/9503 382/145 |
| 2010/0133257 A1* | 6/2010 | Sorabji | H01L 21/67115 219/447.1 |
| 2016/0126128 A1 | 5/2016 | Bonora et al. | |
| 2019/0325601 A1* | 10/2019 | Chen | G06T 7/0004 |
| 2021/0098274 A1* | 4/2021 | Kim | H01L 21/68707 |

FOREIGN PATENT DOCUMENTS

| | | | | |
|---|---|---|---|---|
| CN | 107548518 | | 1/2018 | |
| CN | 107548518 A | * | 1/2018 | ............. G05B 19/19 |
| CN | 113412534 | | 9/2021 | |
| JP | 2004031396 | | 1/2004 | |
| JP | 2012508456 | | 4/2012 | |
| JP | 5614326 B2 | * | 10/2014 | ....... H01L 21/67742 |
| JP | 2017098540 | | 6/2017 | |
| JP | 2018523288 | | 8/2018 | |
| JP | 2018182217 | | 11/2018 | |
| JP | 2022520038 | | 3/2022 | |
| JP | 202569216 | | 4/2025 | |
| KR | 20150005554 A | | 1/2015 | |
| KR | 20160030329 A | | 3/2016 | |
| KR | 20170081227 A | | 7/2017 | |
| KR | 20180033447 A | | 4/2018 | |
| SG | 11202108483 | | 9/2021 | |
| WO | WO-2017014818 A1 | * | 1/2017 | ............. G05B 19/19 |

OTHER PUBLICATIONS

International Application Serial No. PCT/US2020/017080, International Search Report mailed Jun. 4, 2020, 4 pgs.
International Application Serial No. PCT/US2020/017080, Written Opinion mailed Jun. 4, 2020, 5 pgs.
"Japanese Application Serial No. 2021-544734, Notification of Reasons for Refusal mailed Mar. 19, 2024", w English translation, 9 pgs.
"Chinese Application Serial No. 202080013341.6, Office Action mailed May 25, 2024", W English Translation, 19 pgs.
"Japanese Application Serial No. 2021-544734, Response filed Jun. 14, 2024 to Notification of Reasons for Refusal mailed Mar. 19, 2024" w/English Claims, 12 pgs.
"Singapore Application Serial No. 11202108483Y, Written Opinion mailed Apr. 12, 2022", 8 pgs.
"International Application Serial No. PCT US2020 017080, International Preliminary Report on Patentability mailed Aug. 19, 2021", 7 pages.
Chinese Application Serial No. 202080013341.6, Response filed Sep. 25, 2024 to Office Action mailed May 25, 2024, W/ English Claims, 4 pgs.
Japanese Application Serial No. 2021-544734, Decision of Rejection mailed Sep. 24, 2024, w/ English Translation, 10 pgs.
Korean Application Serial No. 10-2021-7028732, Notice of Preliminary Rejection mailed Jul. 1, 2024, w/ English Translation, 28 pgs.
Korean Application Serial No. 10-2021-7028732, Response filed Aug. 30, 2024 to Notice of Preliminary Rejection mailed Jul. 1, 2024, w/ English claims, 31 pgs.
Chinese Application Serial No. 202080013341.6, Office Action mailed Jan. 2, 2025, W/English Translation, 14 pgs.
Japanese Application Serial No. 2021-544734, Response filed Jan. 22, 2025 to Decision of Rejection mailed Sep. 24, 2024, w/ current English claims, 14 pgs.
"Chinese Application Serial No. 202080013341.6, Response filed Mar. 3, 2025 to Office Action mailed Jan. 2, 2025", w English claims, 4 pgs.
"Korean Application Serial No. 10-2021-7028732, Final Office Action mailed Mar. 13, 2025", w English translation, 8 pgs.
"Chinese Application Serial No. 202080013341.6, Office Action mailed May 21, 2025", w English Translation, 17 pgs.

* cited by examiner

SUBSTRATE LOCATION DETECTION AND ADJUSTMENT

CLAIM OF PRIORITY

This application is a U.S. National Stage Filing under 35 U.S.C. 371 from International Application No. PCT/US2020/017080, filed on Feb. 6, 2020, and published as WO 2020/163644 A1 on Aug. 13, 2021, which claims the benefit of priority to U.S. Provisional Patent Application No. 62/802,932, to Martin et al, entitled "Wafer Location Detection and Adjustment" filed on Feb. 8, 2019, each of which is incorporated by reference herein in its entirety.

FIELD

The present disclosure relates generally to substrate (for example a wafer) location detection and adjustment using camera images on process tools in semiconductor manufacturing. In some examples, a system and method for positioning a substrate relative to a datum structure such as an edge ring or chuck are provided.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

One method of centering a wafer to an edge ring or electrostatic chuck (ESC) relies on obtaining blanket etch rate and backside particle data with the wafer placed in a "best-guess" wafer center location. The blanket etch rates are obtained with the wafer at this location, and post-etch metrology is then performed on the blanket wafers to determine their deviation from center. A backside particle test uses backside particle imprints of a precoat on the ESC to decide wafer offset relative to the ESC. This information can be used to adjust a vacuum transfer module (VTM) robot calibration and achieve wafer centering. This process is expensive at least for the reason that blanket wafers are costly, and cumbersome.

SUMMARY

In some examples, a system for positioning a wafer relative to a datum structure is provided. An example system comprises a camera arrangement including at least two cameras, each of the at least two cameras including a field of view when positioned in the camera arrangement, each field of view including a peripheral edge of the wafer and a peripheral edge of the datum structure; a processor to receive positional data from each of the at least two cameras and determine, in relation to each field of view, a gap size between the respective peripheral edges of the wafer and the datum location included in the respective field of view; and a controller to adjust a position of the wafer relative to the datum structure based on the determined respective gap sizes.

In some examples, the datum location includes an edge ring. In some examples, the datum location includes a chuck.

In some examples, the camera arrangement is provided in a wall of a wafer processing chamber.

In some examples, the camera arrangement includes a third camera, the third camera providing positional data in relation to a respective third field of view, to the processor.

In some examples, the determined respective gap sizes are compared against respective predetermined gap sizes, the respective predetermined gap sizes associated with a centered or desired position of the wafer in relation to the datum structure.

In some examples, the controller includes a robotic arm of a vacuum transfer module (VTM).

In some examples, the processor identifies a center of the wafer based on the determined respective gap sizes.

In some examples, a system for positioning a wafer relative to a datum structure comprises a camera arrangement including one or more cameras, each of the one or more cameras including a field of view when positioned in the camera arrangement, each field of view including a peripheral edge of the wafer and a peripheral edge of the datum structure; a processor to receive positional data from the or each camera and determine, in relation to each field of view, a gap size between the respective peripheral edges of the wafer and the datum location included in the respective field of view; and a controller to adjust a position of the wafer relative to the datum structure based on the determined respective gap sizes.

In some examples, the one or more cameras includes a single movable camera.

In some examples, the single movable camera is mounted on a robotic arm.

In some examples, the robotic arm is mounted on a vacuum transfer module (VTM).

In some examples, the camera arrangement is provided in a wall of a wafer processing chamber.

DESCRIPTION OF THE DRAWINGS

Some embodiments are illustrated by way of example and not limitation in the figures of the accompanying drawings.

DESCRIPTION

Figure 1:
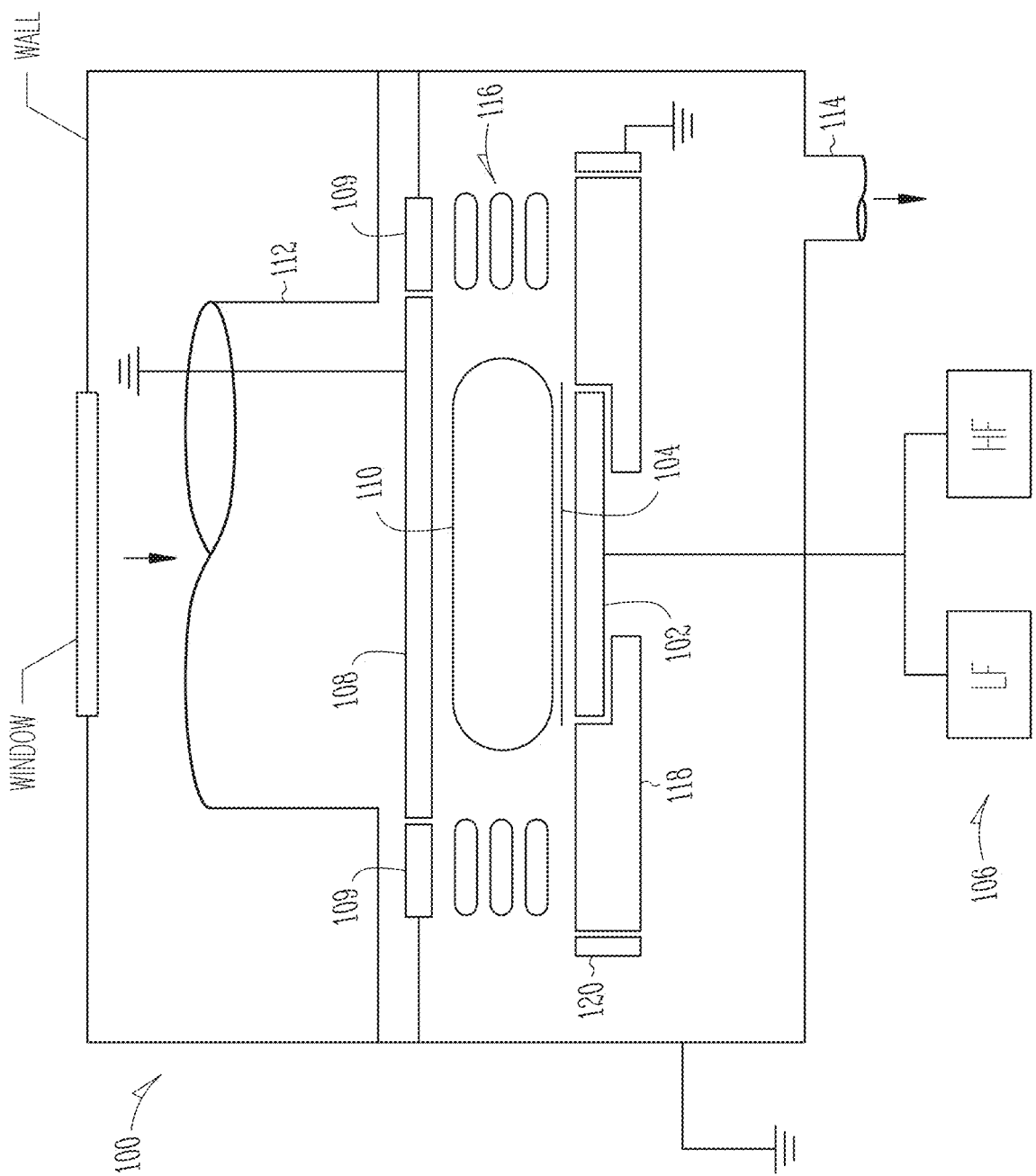
FIG. 1 is a schematic diagram of a reaction chamber within which some examples of the methods of the present disclosure may be employed, according to some examples.

The description that follows includes systems, methods, and techniques that embody illustrative embodiments of the present invention. In the following description, for purposes of explanation, numerous specific details are set forth in order to provide a thorough understanding of example embodiments. It will be evident, however, to one skilled in the art, that the present inventive subject matter may be practiced without these specific details.

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever. The following notice applies to the software and data as described below and in the drawings that form a part of this document: Lam Research Corporation 2018-2020, All Rights Reserved. The term "wafer" as used herein as example is intended to include within its ambit a "substrate" more generally. A substrate may include a photomask, a flat-panel display, and so forth that may also processed with the systems and methods described herein.

An example chamber in which some examples of the present disclosure may be employed, with appropriate chamber modifications for film deposition and control testing, is shown in FIG. 1 of the accompanying drawings. A typical plasma etching (or deposition) apparatus comprises a reactor in which there is a chamber through which reactive gas or gases flow. Within the chamber, the gases are ionized into a plasma, typically by radio frequency energy. The highly reactive ions of the plasma gas are able to react with material, such as a polymer mask on a surface of a semiconductor wafer being processed into integrated circuits (IC's). Prior to etching, the wafer is placed in the chamber and held in proper position by a chuck or holder which exposes a top surface of the wafer to the plasma gas. There are several types of chucks known in the art. The chuck provides an isothermal surface and serves as a heat sink for the wafer. In one type, a semiconductor wafer is held in place for etching by mechanical clamping means. In another type of chuck, a semiconductor wafer is held in place by electrostatic force generated by an electric field between the chuck and wafer. The present methods are applicable to both types of chucks.

FIG. 1 illustrates a capacitively-coupled plasma processing chamber 100, representing an exemplary plasma processing chamber of the types typically employed to etch a substrate. Referring now to FIG. 1, a chuck 102, representing the workpiece holder on which a substrate, such as a wafer 104, is positioned during etching. The chuck 102 may be implemented by any suitable chucking technique, e.g., electrostatic, mechanical, clamping, vacuum, or the like. During etching, the chuck 102 is typically supplied with dual RF frequencies (a low frequency and high frequency), for example 2 MHz and 27 MHz, simultaneously, during etching by a dual frequency source 106.

A vacuum transfer module (VTM) (not shown) may be used to place and center (or position) the wafer 104 on the chuck 102. Accurate wafer positioning or centering is typically a key aspect when seeking to perform successfully certain processing operations on the wafer 104 within the processing chamber 100. These operations may include deposition, etch, and edge bevel removal (EBR), for example. Other operations are possible. In some examples, a VTM includes one or more robotic controls or arms to manipulate the wafer 104 as it is placed on the chuck 102. In examples of the present disclosure, a VTM robotic arm is guided during wafer placement and centering by feedback or other data generated by an array of cameras and a VTM control module discussed further below. One or more components of the processing chamber 100 may be used as a datum point in determining a position or center of the wafer 104. In some examples, a proximity of one or more sites at the peripheral edge of the wafer 104 to a processing chamber component is used in determining a wafer center. Two or three peripheral edge sites of the wafer 104 may be used in some examples. In some examples, a datum component includes an edge ring 118.

Referring again to FIG. 1, an upper electrode 108 is located above the wafer 104. The upper electrode 108 is grounded. FIG. 1 illustrates an etching reactor where the surface of the upper electrode 108 is larger than the surface of the chuck 102 and the wafer 104. During etching, plasma 110 is formed from etchant source gas supplied via a gas line 112 and pumped out through an exhaust line 114. An electrical insulator ring 109 insulates the upper electrode 108 from the processing chamber 100.

Confinement rings 116 may be placed between the upper electrode 108 and a bottom electrode, such as the chuck 102 in FIG. 1. In general, confinement rings 116 help confine the etching plasma 110 to the region above the wafer 104 to improve process control and to ensure repeatability.

When RF power is supplied to chuck 102 from dual frequency source 106, equipotential field lines are set up over wafer 104. The equipotential field lines are the electric field lines across the plasma sheath that is between wafer 104 and the plasma 110. In some examples, the equipotential surfaces and electric field lines are normal to each other. There are equipotential surfaces between the wafer 104 and the plasma 110. The electric field lines accelerate charged particles across these equipotential surfaces. During plasma processing, the positive ions accelerate across the equipotential field lines to impinge on the surface of wafer 104, thereby providing the desired etch effect, such as improving etch directionality. Due to the geometry of the upper electrode 108 and the chuck 102, the field lines may not be uniform across the wafer surface and may vary significantly at the edge of the wafer 104. Accordingly, an edge (or focus) ring 118 is typically provided to improve process uniformity across the entire wafer surface. With reference to FIG. 1, the wafer 104 is shown disposed within an edge ring 118, which may be formed of a suitable dielectric material such as ceramic, quartz, plastic, or the like. Thus, the presence of the edge ring 118 allows the equipotential field lines to be disposed substantially uniformly over the entire surface of the wafer 104.

An electrically conductive shield 120 substantially encircles the edge ring 118. The electrically conductive shield 120 is configured to be substantially grounded within the processing chamber 100. The electrically conductive shield 120 prevents the presence of unwanted equipotential field lines outside of the edge ring 118.

As discussed above, there may be significant challenges associated with the use of blanket wafers in wafer centering operations. Examples of the present disclosure do not require blanket wafer images and instead use images captured by cameras mounted above a wafer 104 to measure and guide wafer centering operations. Wafer centering operations may be conducted relative to a datum structure or component within the process module, such as the edge ring 118 or the chuck 102, such as an electrostatic chuck (ESC). In some examples, positional data is transmitted as feedback to a wafer transferring module (for example, a VTM) to adjust its calibration until the wafer 104 is appropriately centered on the chuck 102.

An example of the present disclosure performs an in-situ measurement of the wafer 104 during wafer centering operations and provides immediate feedback to a controller user interface (UI) of a control module. With a wafer 104 placed on the chuck 102 in the processing chamber 100, an array of one or more measurement cameras takes an image that may include one or more sites or portions at the outer peripheral edge of the wafer 104, and at least one inner edge of the edge ring 118. Image processing software locates the wafer periphery and inner edge of the edge ring 118 and calculates a separation distance, or gap, between them. In some examples, this measurement is performed at several points around the periphery of the wafer 104. Measurement results are then used to adjust the VTM robotic controls for placing the wafer 104 on the chuck 102 in the processing chamber 100. Checking the progress of the wafer centering operations can be performed quickly by repeating the above procedure.

Figure 2:
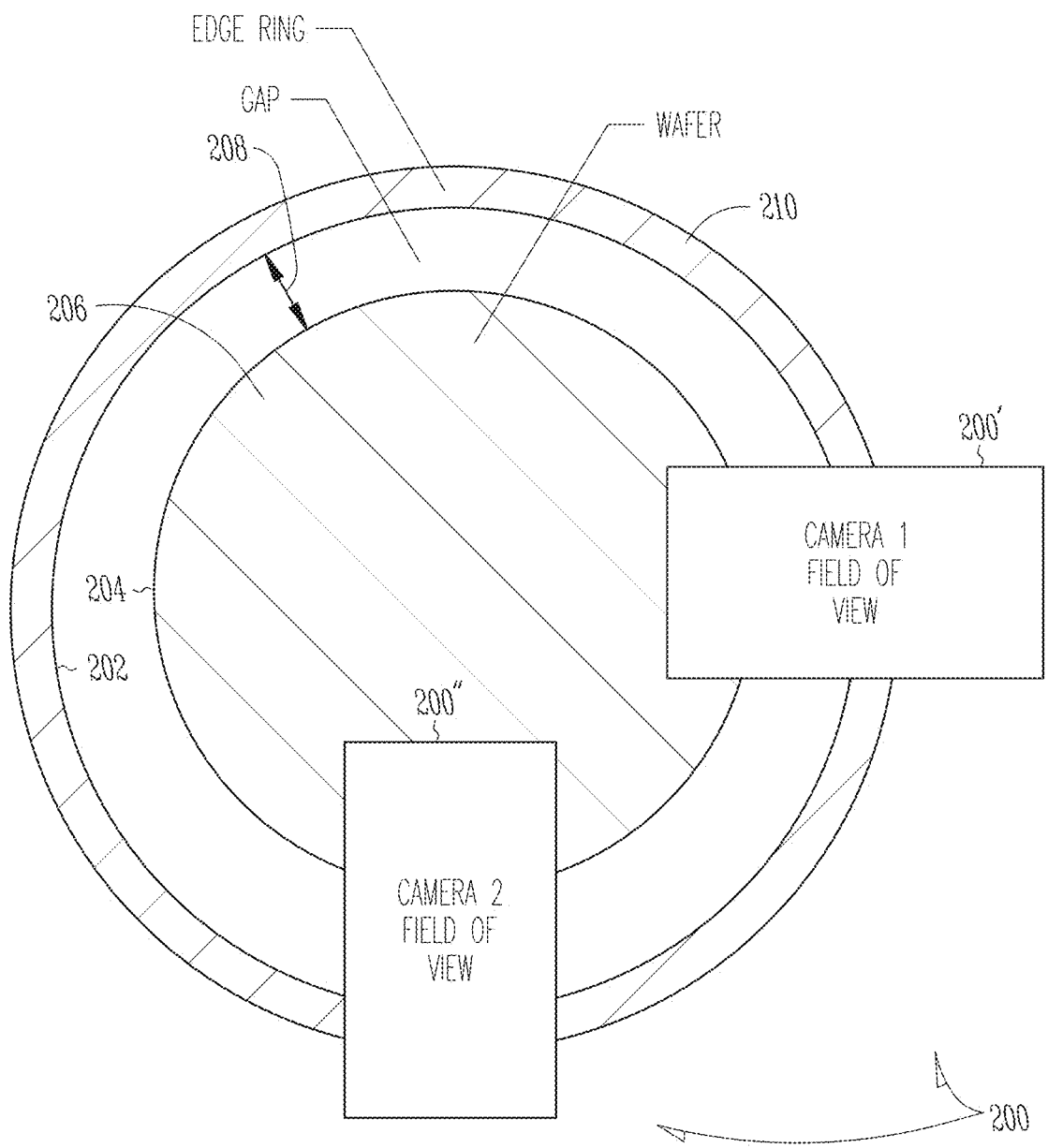
FIGS. 2-3 depict camera arrangements, according to some examples.

With reference to FIG. 2, an arrangement 200 of one or more cameras (for example, camera 1 and camera 2) associated with a processing chamber 100 can capture images and make image measurements. In some examples, each of the cameras 1 and 2 has a respective field of view 200' and 200" that can detect an inner edge 202 of an edge ring 210 and the peripheral edge 204 of a wafer 206. A separation distance or gap 208 between the inner edge 202 of the edge ring 210 and the peripheral edge 204 can be detected and measured by the cameras 1 and 2. A convenient example arrangement for performing the gap 208 measurement includes providing a vacuum-seal window within a wall of the processing chamber 100 and locating the cameras 1 and 2 in the window. In some examples, image capture and gap measurement are performed during startup and maintenance phases of the processing chamber 100. In other examples, the cameras 1 and 2 are mounted onto a robotic arm of a vacuum transfer module (VTM) to facilitate centering and gap measurements being taken under control of an operator of the processing chamber 100. In some examples, lighting is controlled during gap image measurements.

Figure 12:
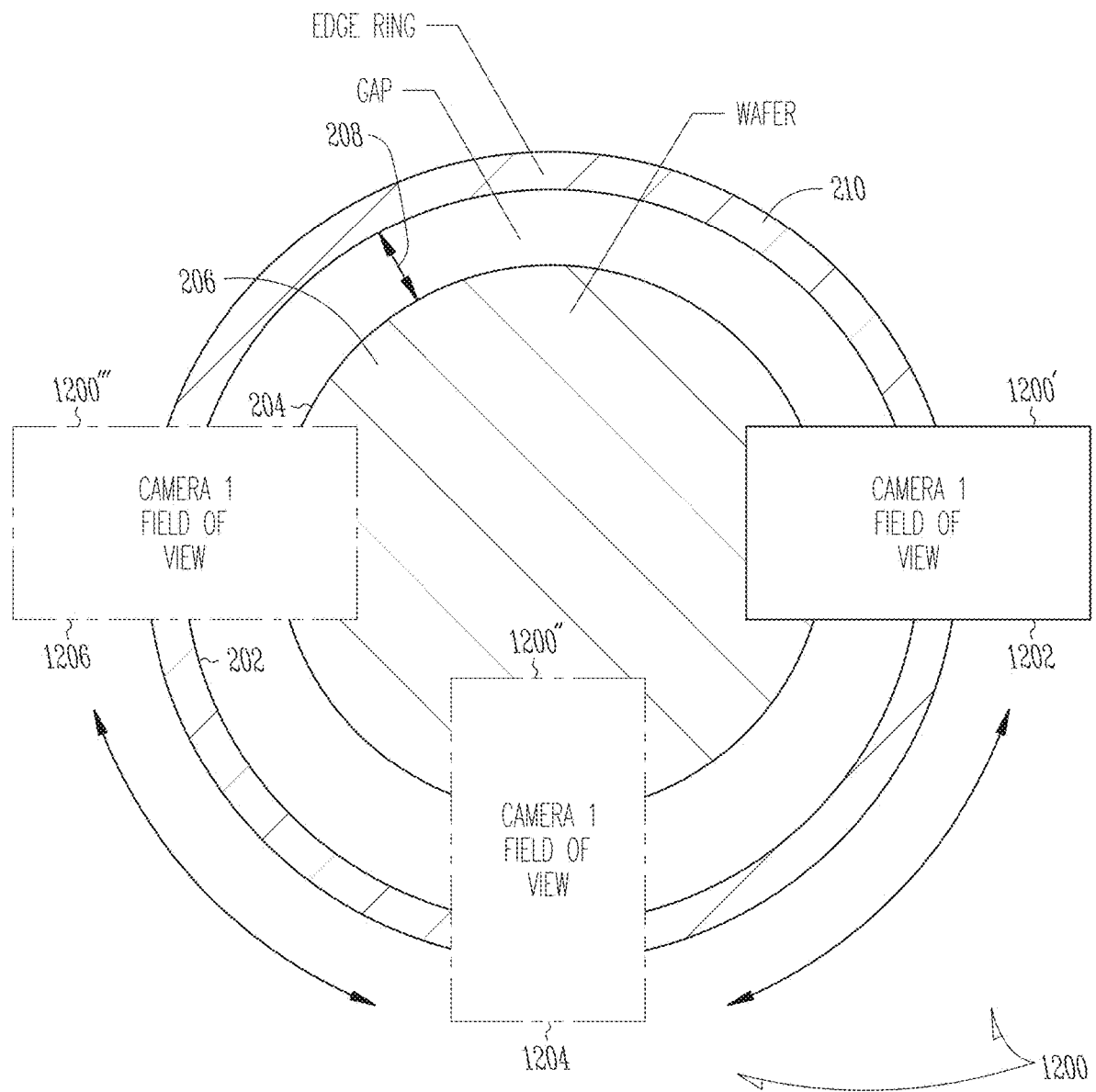
FIG. 12 depicts a single camera arrangement, according to an example.

Although the arrangement 200 in FIG. 2 includes two cameras, other arrangements are possible. For example, a single, moveable camera may be arranged in two different positions to obtain respective fields of view 200 and 200". In yet another example arrangement 1200 shown in FIG. 12, a single movable camera can be moved between positions 1202, 1204, and 1206 to obtain or generate one or more respective fields of view 1200', 1200" and 1200''' at those camera positions. Some or all the cameras in the various examples described herein may be fixed or movable. Some examples may include or generate a composite field of view, for example a single view taken by a single camera that includes or encompasses a plurality of sub-views. Example sub-views may include those at positions 1202, 1204, and 1206 in FIG. 12. Other combinations of fields of view and camera arrangements are possible.

Figure 3:
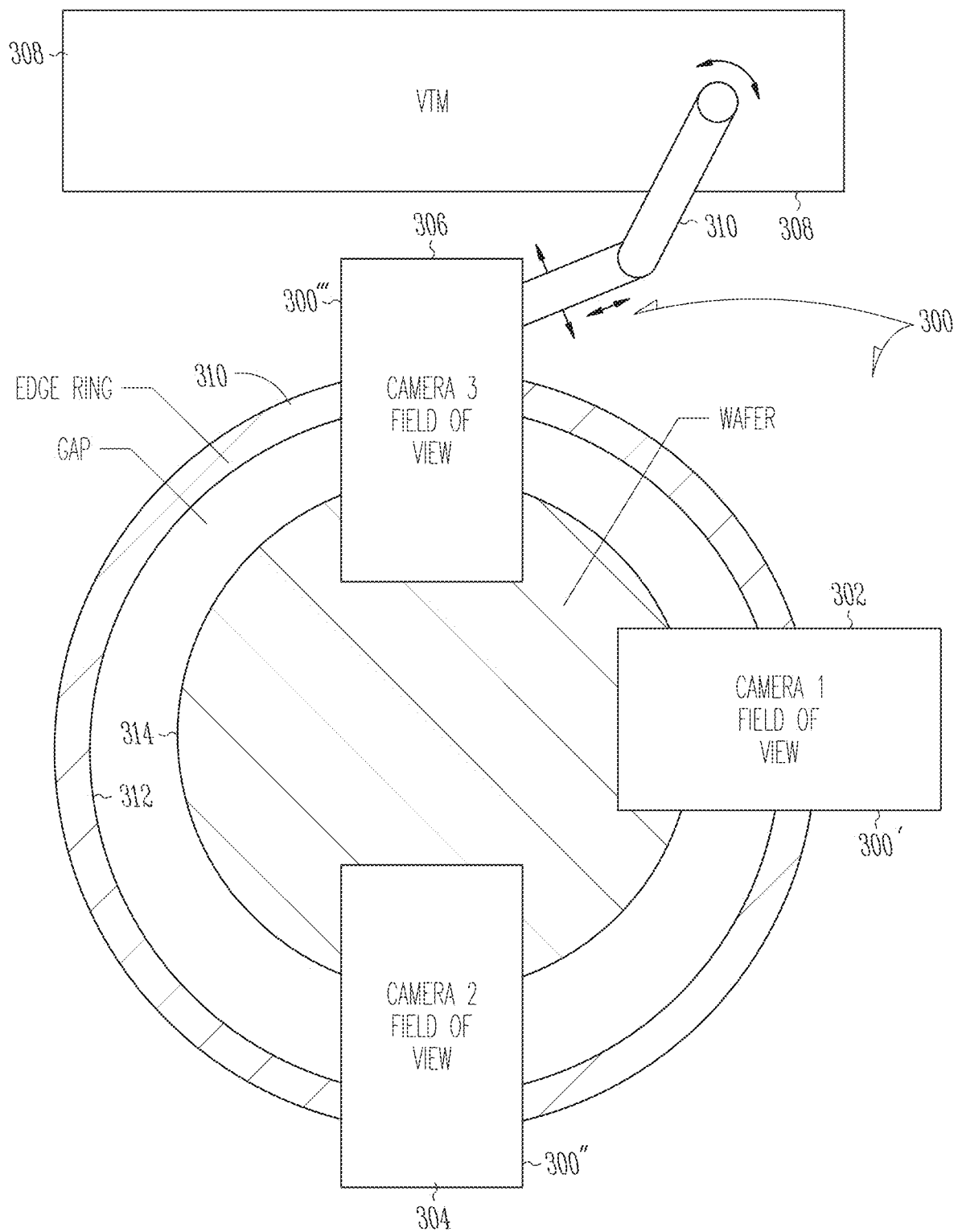

An alternate camera arrangement 300 is shown in FIG. 3. The illustrated arrangement includes three cameras 1, 2, and 3 (labeled 302, 304, and 306 in the view) positioned to look down on and take images of an edge ring 310 and wafer 312 disposed within a processing chamber, such as a processing chamber 100 of FIG. 1. Each camera 1, 2, and 3 has a respective field of view 300', 300", and 300'''. A VTM 308 (not shown to scale) may be located adjacent the monitored processing chamber 100. In some examples, a single VTM 308 has a rectangular footprint that spans an area large enough to service a plurality of adjacent processing chambers 100. In some examples, a single VTM 308 has five processing chamber 100 positioned along each side of it. The VTM 308 (FIG. 3) may include a robotic arm 310 (not shown to scale) for manipulating one or more cameras between respective fields of view 302, 304, and 306. A single camera or several cameras may be mounted on the VTM arm 310 so that a field of view or gap measurement can be established or taken at the discretion of an operator, or by a processor under automation. In some examples, illumination of the fields of view is controlled, for example during a taking of a gap measurement or when monitoring a field of view. Although the arrangement in FIG. 3 includes three cameras 1-3, a single moving camera or several stationary cameras may be used to take such measurements.

Figure 4:
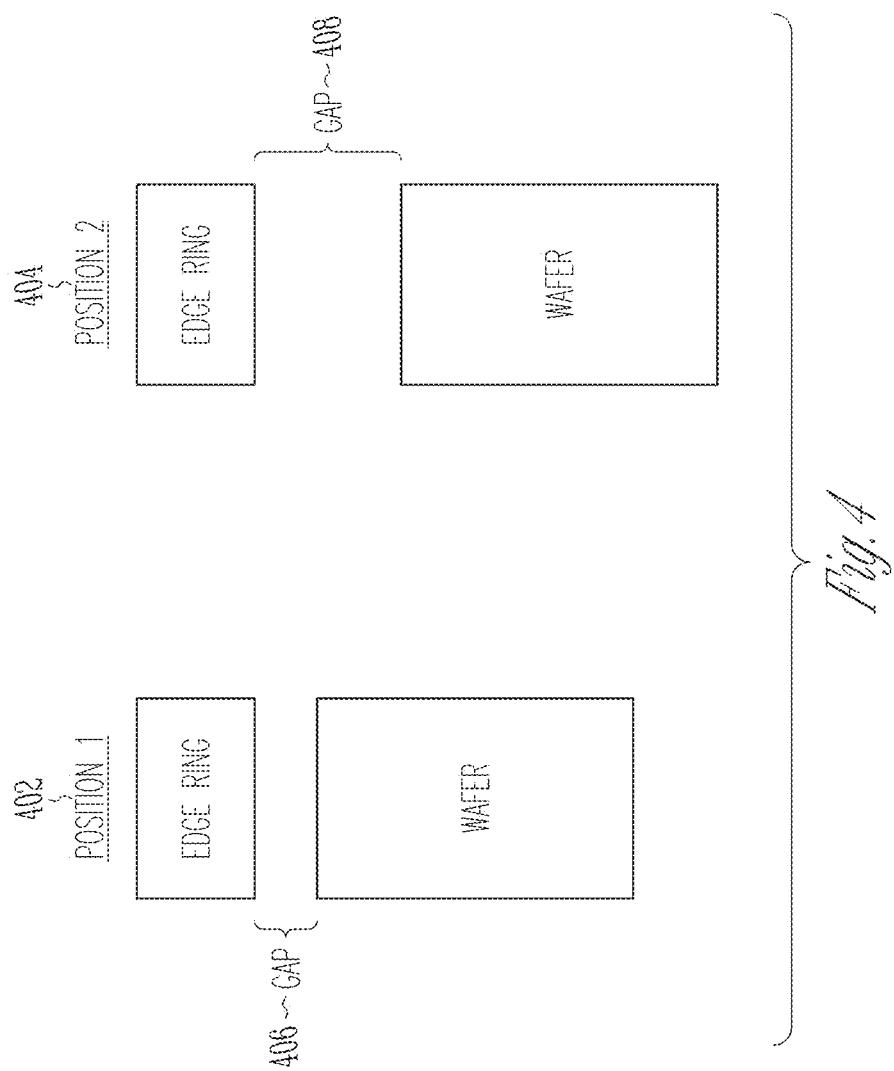
FIGS. 4-8 depict camera images, according to some examples.

FIG. 4 shows pictorial example images 402 and 404 captured by the cameras 1 and 2 of the various embodiments described herein. The image 402 on the left depicts a relatively small gap 406 between an inner edge 202 of an edge ring 210 and a peripheral edge 204 of a wafer 206. The camera 1 has thus detected that the wafer placement is relatively close to the edge ring 210. The image 404 on the right depicts a larger gap 408 between the inner edge 202 of the edge ring 210 and the peripheral edge 204 of the wafer 206. Camera 2 has detected that the wafer placement is further away from the edge ring 210. A wafer-to-edge ring gap 208 in FIG. 2 (or 406 and 408 in FIG. 4) may be adjusted or set based on different VTM robot settings, in some examples. A bare silicon (Si) wafer 206 (for example) may be employed, but other types of wafer 206 are possible. Other examples may include use of a calibration wafer carrying markings indicating a reference angle and/or wafer radius and, in some examples, may be provided in a differentiating color within the images 402 and 404. Information regarding the gaps 406 and 408 (positional data) may be transmitted dynamically as feedback to the VTM 308 during wafer centering operations. Based on the feedback received, a wafer position may be adjusted incrementally or continuously until preset or predetermined gap values for a wafer-central position are established.

Figure 5:
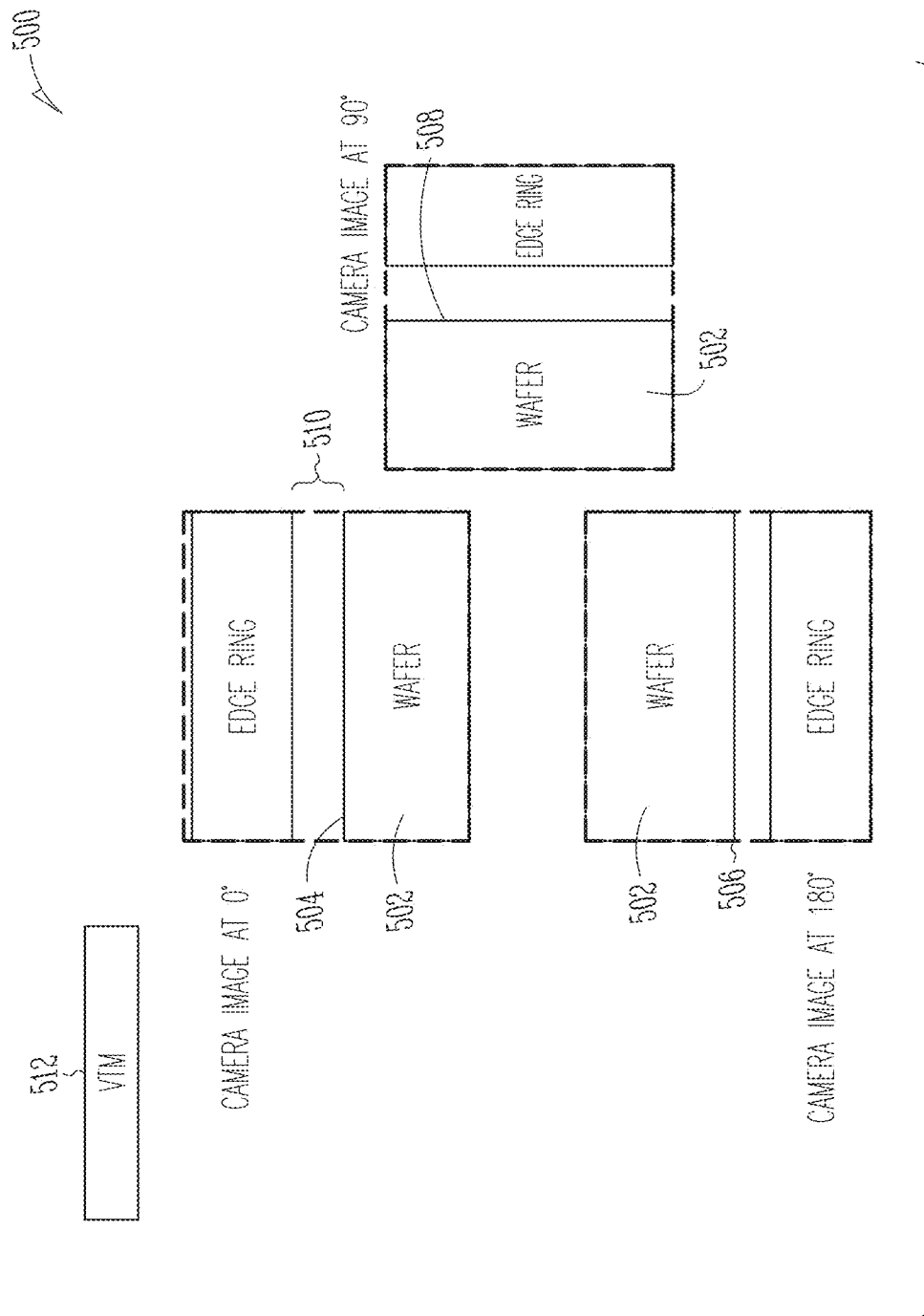

FIGS. 5-8 show respective example images (for example in fields of view 300', 300", and 300''' taken by cameras 1, 2 and 3 in FIG. 3) of peripheral edges 204 of a wafer 502 corresponding to the location of each camera next to an associated inner edge 202 of an edge ring 210. The wafer 502 is positioned on a chuck 102 within a processing chamber 100. Although the peripheral edges of the wafer 502 are represented by linear lines, it will be appreciated that in real-life they will be slightly arcuate. A location of a VTM 512 adjacent the processing chamber 100 is shown in FIG. 5. The VTM 512 is positioned similarly in each of the views of FIGS. 6-8. In the view 500 of FIG. 5, initial or datum locations 504, 506, and 508 of a top edge, bottom edge, and right-side edge of the wafer 502 are indicated respectively in FIG. 5. A separation distance or top gap 510 (for purposes of this example) may be derived and noted accordingly.

Figure 6:
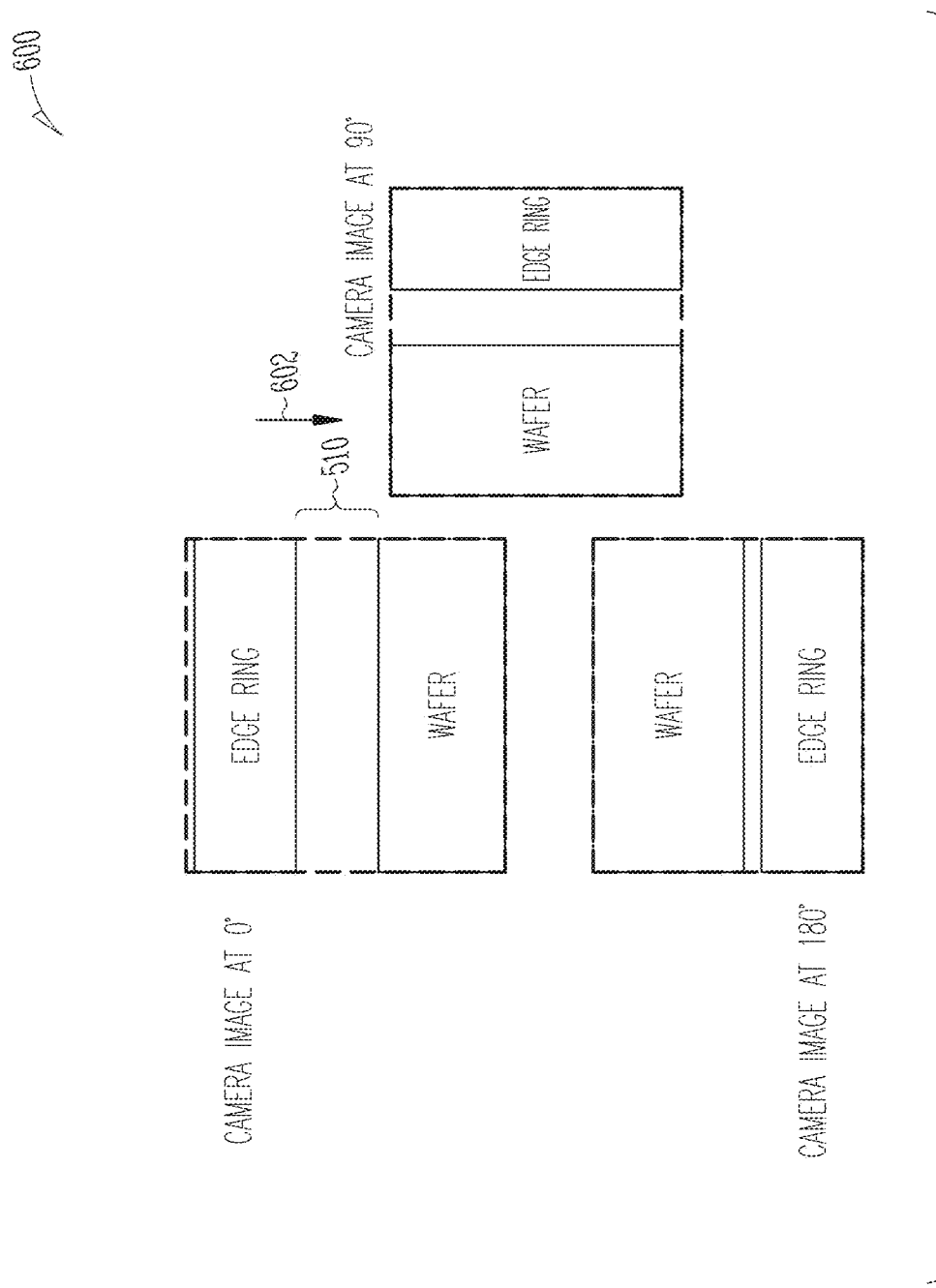

The images in FIG. 6 are representative of a wafer movement in the direction 602 under control of a robotic arm of the VTM 512 away from the VTM 512 location (FIG. 5). The top gap 510 has widened accordingly.

Figure 7:
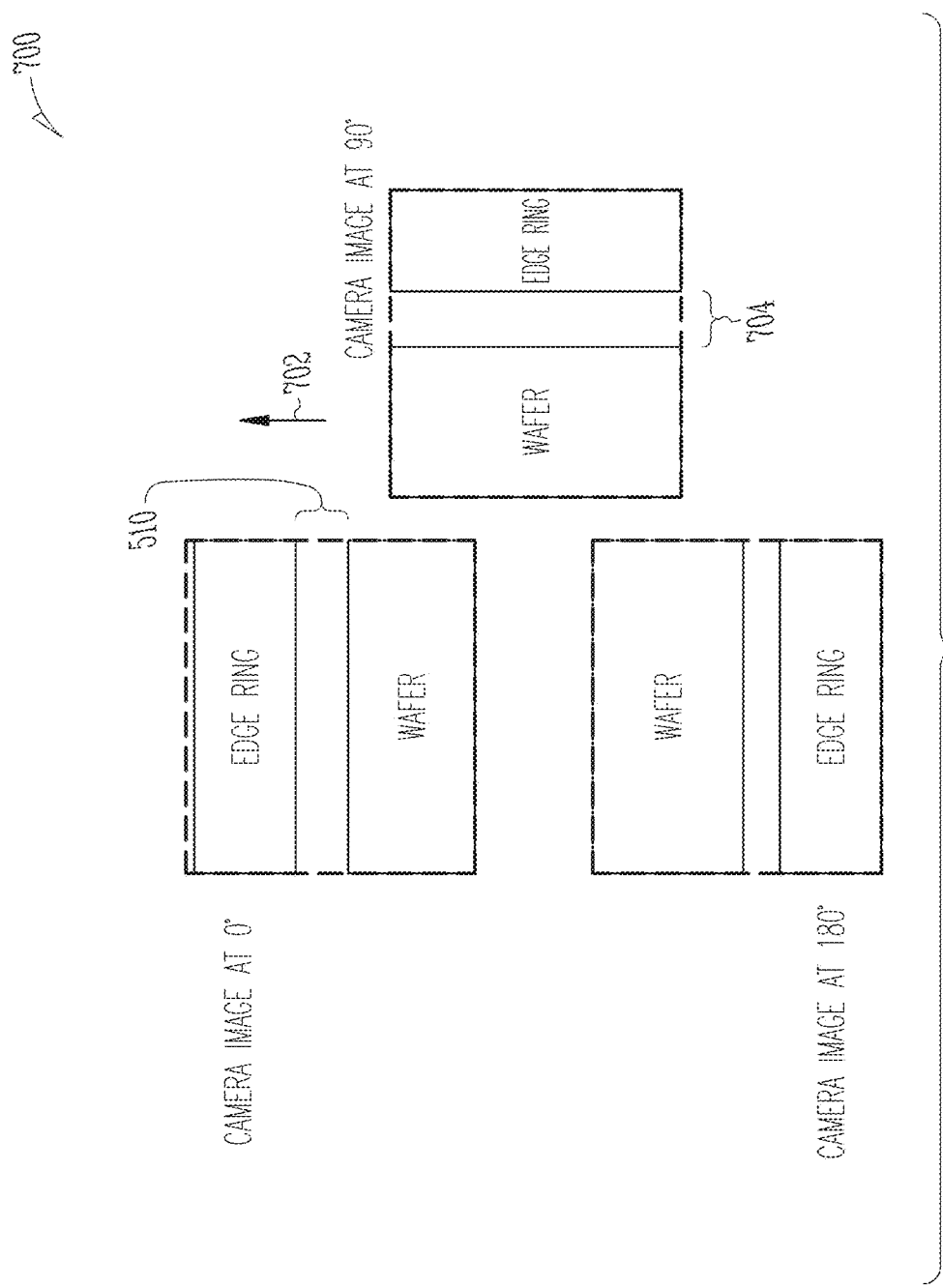

The images in FIG. 7 are representative of wafer movement in the 702 towards the VTM 512 back to the initial or datum wafer locations. The size of top gap 510 has been restored accordingly.

Figure 8:
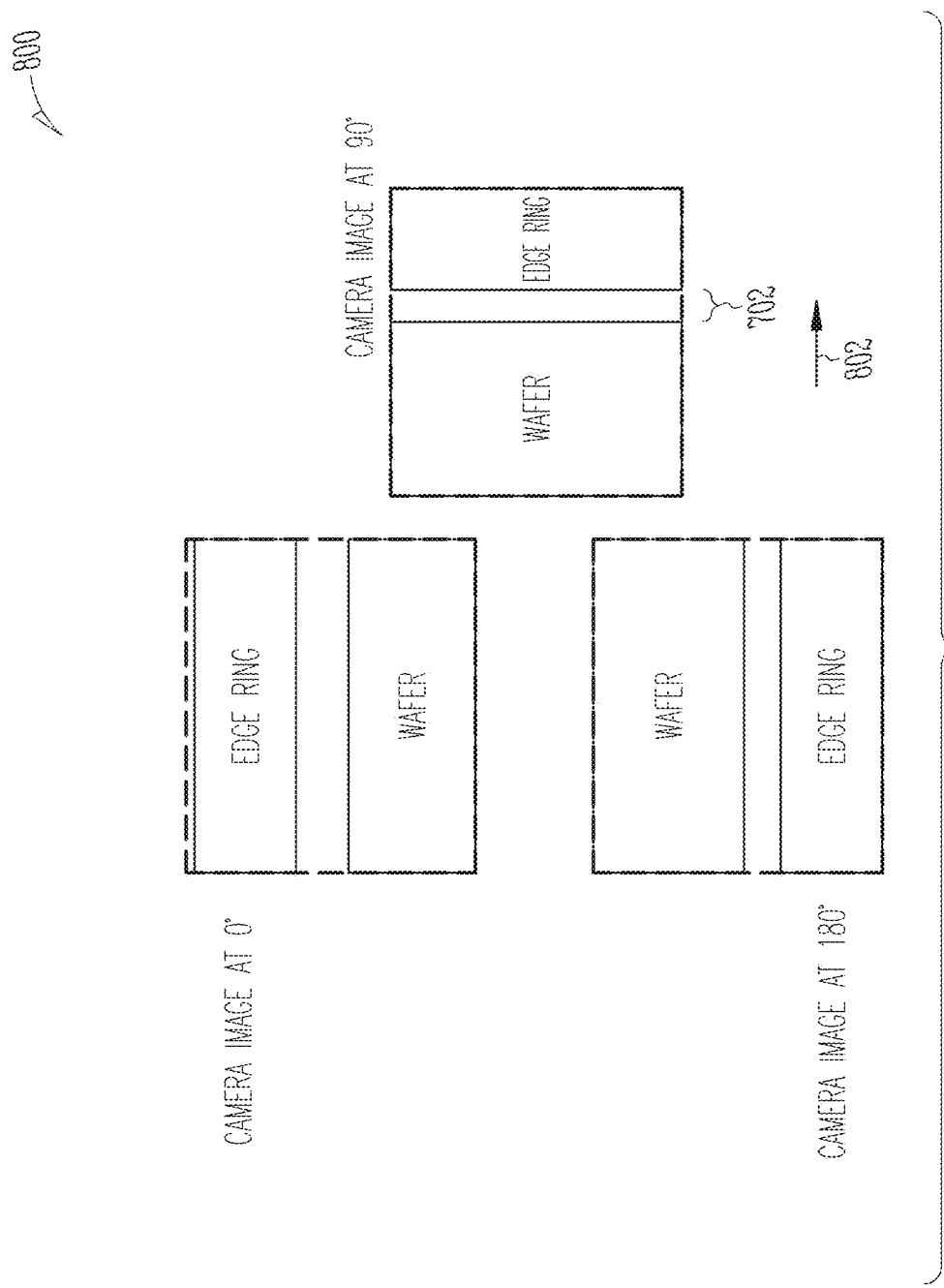

For further purposes of this example, an initial side gap 704 (FIG. 7) may be derived and noted. The images in FIG. 8 are representative of wafer movement under control of a robotic arm of the VTM 512 in the direction 802 to the right. The side gap 704 has narrowed accordingly. Positional data representative of such wafer movement, derived from top and side gap images captured by the array of cameras 1, 2, and 3, are dynamically transmitted back to a control module of the VTM 512 to facilitate the location and centering of a wafer 502 during a wafer placement and centering operation.

Figure 9:
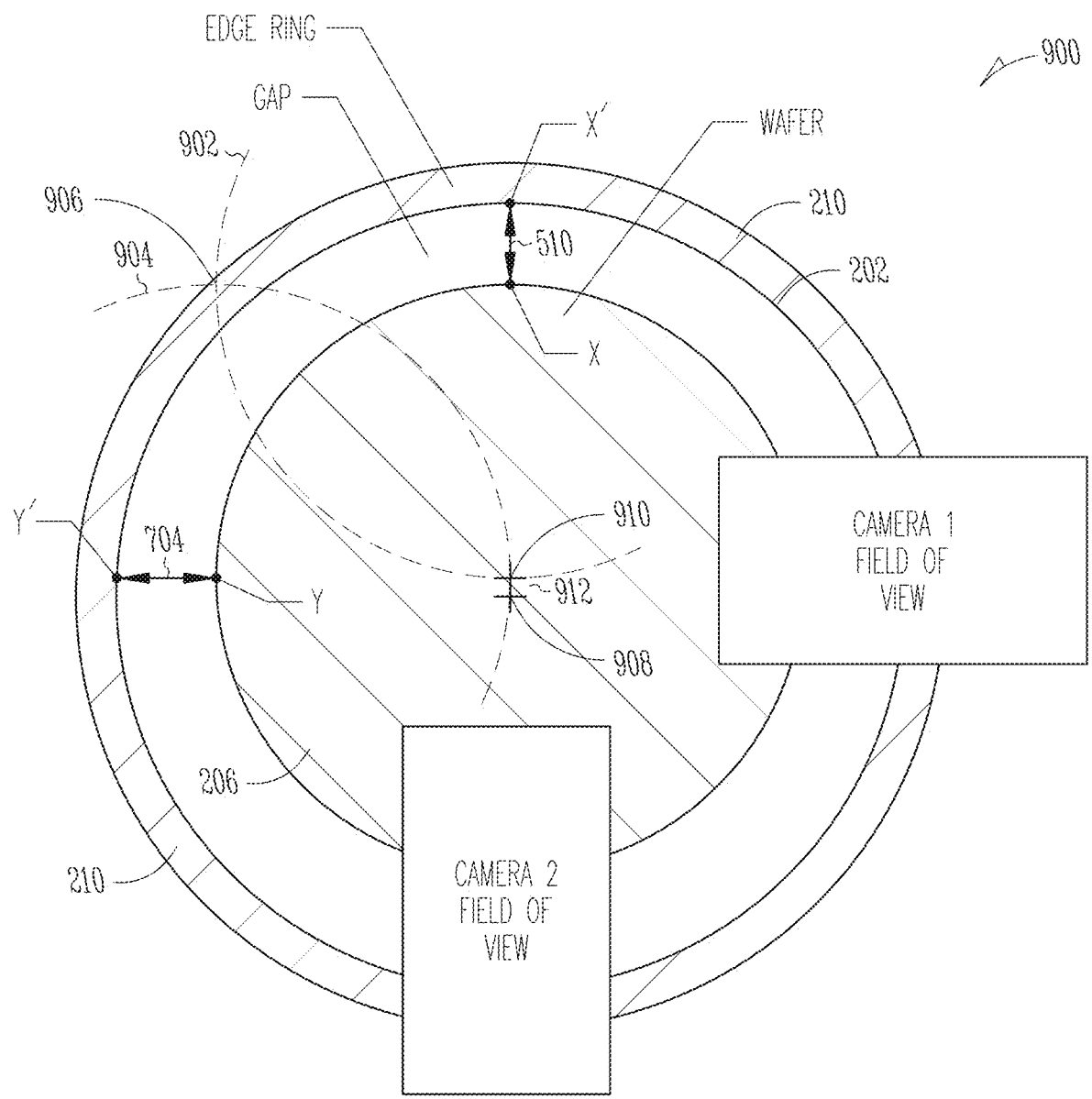
FIG. 9 depicts a camera arrangement, according to an example embodiment.

With reference to FIG. 9, an arrangement 900 of a wafer 206 and edge ring 210 is shown. Using the edge ring 210 as a datum, a center of a wafer 206 of known diameter (and hence known radius) may be determined based on measurements of a top gap 510 and a side gap 704 or based on locations associated with gaps 510 and 704. Based on images taken by cameras 1 and 2 shown in the view, the separation distance or top gap 510 between a location X on a peripheral edge 204 of the wafer 206, and an adjacent location X' on the inner edge 202 of an edge ring 210, may be determined. A separation distance or side gap 704 may be determined in a similar manner for locations Y and Y'. For simplicity, the cameras 1 and 2 are not shown at the true locations in the top and left quadrants where images of top gap 510 and side gap 704 would be taken in real-life, but rather at camera locations in the right and bottom quadrants, as illustrated.

In some examples, the locations of points X' and Y' are known or can be derived, for example, based on a known location or dimensions of the edge ring 210 which can serve as a datum component in this regard. A center 908 of the edge ring 210 can be established accordingly as a reference for wafer centering and processing purposes.

Using the known locations of points X' and Y', the top and side gaps 510 and 704 may be applied respectively to determine the location of points X and Y on the peripheral edge 204 of the wafer 206. The radius of the wafer 206 is known and a notional circumference (or an arc portion of a circumference), based on the wafer radius, can be circumscribed around each point X and Y accordingly. The notional circumference for point X is labeled 902, and 904 for point Y, respectively. An intersection of the notional circumferences 902 and 904 within the periphery of the wafer 206 establishes a center of the wafer 206 at center 910. An intersection of the circumferences 902 and 904 (at point 906) outside the periphery of the wafer 206 may be discarded as an invalid result as it will be appreciated that a center of a wafer 206 will fall within its periphery. The determined center 910 of the wafer 206 may be compared on a dynamic basis against the true center 908 of the edge ring 210 to derive offset or positional data 912.

In some examples, feedback based on the offset data is provided to the control module of the VTM 512 to adjust a position or path of a wafer 206 during wafer centering. During wafer centering operations, positional adjustments for a wafer 206 may be made by a control module of a VTM 512 based on determinations of the top and side gaps 510 and 704, or locations of the edge ring 210 and wafer centers 908 and 910 or based on a combination of both sets of data or portions thereof.

Figure 10:
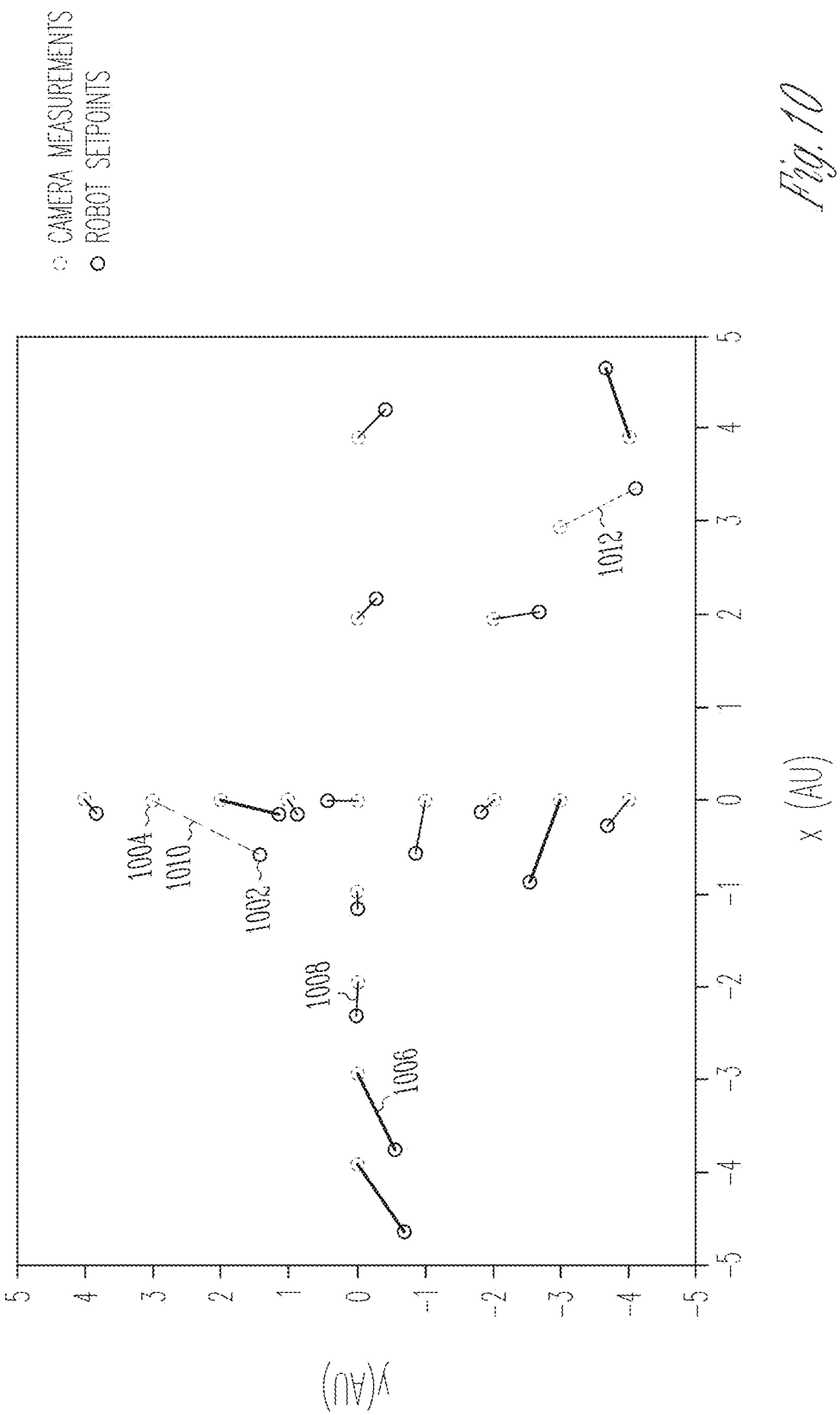
FIG. 10 depicts a scatter plot, according to an example.

FIG. 10 depicts a scatter plot 1000 showing a measured change in a wafer center obtained with camera measurements (solid ring dots 1002) and VTM robot setpoint commands (dashed ring dots 1004). Line segments 1006 and 1008 link a measured wafer center 1002 to its associated robot setpoint 1004. Relatively shorter line segments 1008, shown in solid outline, are indicative that the respective measured wafer center 1002 is within specification of the VTM robot wafer setpoint 1004. This is reflective of the robot repeatability specification mentioned above. Relatively longer line segments 1006 are indicative that the measured wafer center 1002 is within, for example, 133% of the VTM robot spec. Other margins of accuracy may be used. The hashed line 1010 indicates for example a single wafer measurement in excess of 133% of the robot setpoint. The dotted line 1012 indicates for example that a camera measurement that correctly caught an error in the robot placement. Other indicators are possible.

Figure 11:
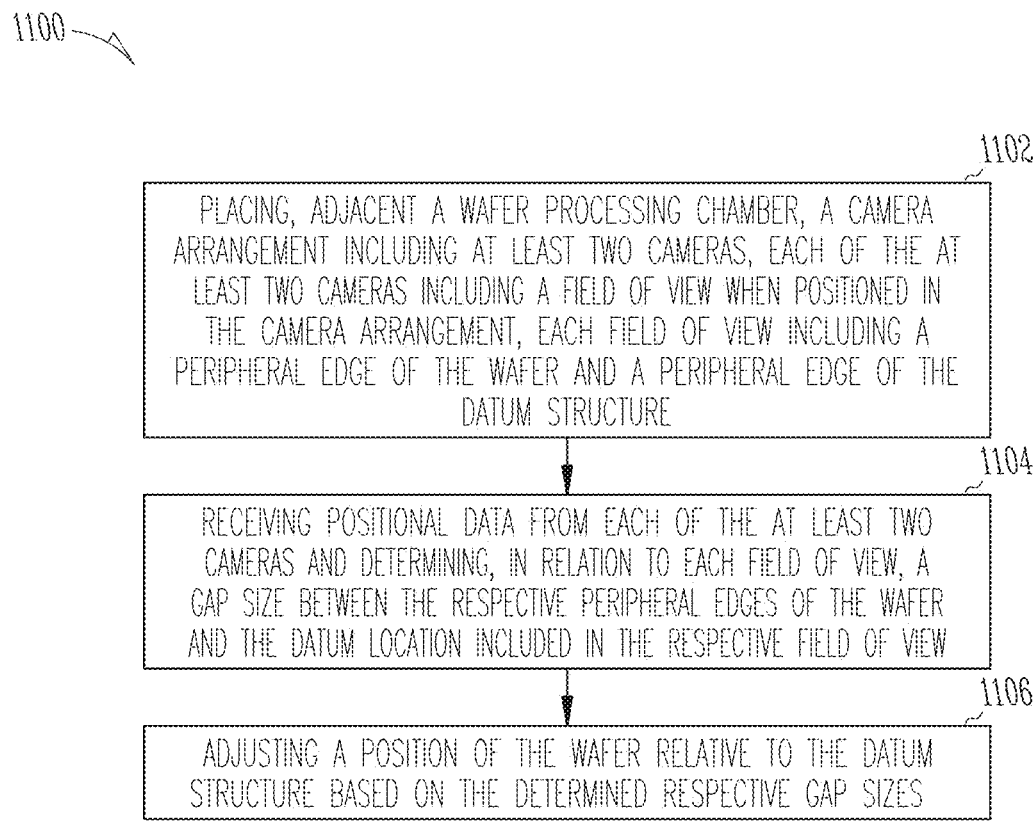
FIG. 11 depicts operations in a method of centering a wafer, according to an example.

Thus, in some examples, methods for centering a wafer are provided. With reference to FIG. 11, a method 1100 for centering a wafer relative to a datum structure comprises, at operation 1102, placing, adjacent a wafer processing chamber, a camera arrangement including at least two cameras, each of the at least two cameras including a field of view when positioned in the camera arrangement, each field of view including a peripheral edge of the wafer and a peripheral edge of the datum structure; at 1104, receiving positional data from each of the at least two cameras and determining, in relation to each field of view, a gap size between the respective peripheral edges of the wafer and the datum location included in the respective field of view; and, at 1106, adjusting a position of the wafer relative to the datum structure based on the determined respective gap sizes.

In some examples, the datum location includes an edge ring. In some examples, the datum location includes a chuck.

In some examples, the method 1100 further comprises providing the camera arrangement in a wall of the wafer processing chamber.

In some examples, the method 1100 further comprises including a third camera in the camera arrangement, and providing positional data from the third camera, in relation to a respective third field of view, to the processor.

In some examples, the method 1100 further comprises comparing the determined respective gap sizes against respective predetermined gap sizes, the respective predetermined gap sizes associated with a centered or desired position of the wafer in relation to the datum structure or the wafer processing chamber.

In some examples, the method 1100 further comprising including, in the controller, a robotic arm of a vacuum transfer module (VTM).

Thus, embodiments are provided for camera-based image sensing to position a wafer location relative to an edge ring 210 inside a processing chamber 100. Examples of the present disclosure may provide improved speed, cost and accuracy. Some examples may facilitate making quick in situ measurements during wafer positioning or centering operations. Normally blanket wafers are etched in the process module and metrology is performed on the wafers 206 to determine the wafer centering. In a fab, where wafers 206 are typically tracked, premeasured, and moved, conventional measurement operations may take a given period to complete. Present processes, on the other hand, may reduce that time by a factor of eight. On a lab process tool, using methods disclosed herein, performing these operations may take only 12.5% of the conventional time necessary in a fab.

Conventional methods of wafer centering typically take a long time to complete, and often employ blanket wafers. Some example methods herein incur only a one-time cost. Camera measurements of the present disclosure can determine a wafer placement in most cases to within specification of a VTM robot control setpoint, in some examples. In all but one example of FIG. 10, the camera measurements determined a wafer placement to within specification of conventional backside particle metrology. Embodiments may be configured or adjusted as needed by making changes in both hardware and image processing algorithms.

Although an embodiment has been described with reference to specific example embodiments, it will be evident that various modifications and changes may be made to these embodiments without departing from the broader scope of the embodiments. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The invention claimed is:

1. A system for positioning a wafer relative to a datum structure, the system comprising:
   a camera arrangement including at least two cameras, each of the at least two cameras including a field of view when positioned in the camera arrangement, each field of view including a peripheral edge of the wafer and a peripheral edge of the datum structure;
   a processor to:
   receive positional data from each of the at least two cameras,
   identify a first point on an edge of the datum structure in a first field of view and a second point on an edge of the datum structure in a second field of view,
   determine a center of the datum structure based on the first and second points,
   determine, in relation to each field of view, a gap size between the respective peripheral edges of the wafer and a datum location included in the respective field of view,
   identify a first point on the peripheral edge of the wafer in the first field of view based on the first point on the edge of the datum structure and a first gap size, and a second point on the peripheral edge of the wafer in the second field of view based on the second point on the edge of the datum structure and a second gap size,
   determine a center of the wafer by circumscribing a first notional circumference around the first point on the peripheral edge of the wafer and a second notional circumference around the second point on the peripheral edge of the wafer, and identifying an intersection of the first and second notional circumferences within a periphery of the wafer as the center of the wafer, and determine an offset between a center of the datum structure and a center of the wafer; and
   a controller to adjust a position of the wafer relative to the datum structure based on the determined respective gap sizes and the offset between the center of the datum structure and the center of the wafer.

2. The system of claim 1, wherein the datum location includes an edge ring.

3. The system of claim 1, wherein the datum location includes a chuck.

4. The system of claim 1, wherein the camera arrangement is provided in a wall of a wafer processing chamber.

5. The system of claim 1, wherein the camera arrangement includes a third camera, the third camera providing positional data in relation to a respective third field of view, to the processor.

6. The system of claim 1, wherein the determined respective gap sizes are compared against respective predetermined gap sizes, the respective predetermined gap sizes associated with a centered or desired position of the wafer in relation to the datum structure.

7. The system of claim 1, wherein the controller includes a robotic arm of a vacuum transfer module (VTM).

8. The system of claim 1, wherein the processor identifies a center of the wafer based on the determined respective gap sizes.

9. The system of claim 1, wherein:
   the at least two cameras consist of two cameras; and
   the center of the wafer is determined based on two locations on two peripheral edges of the wafer in two fields of view of the two cameras and a radius of the wafer.

10. The system of claim 9, wherein the center of the wafer is determined by operations comprising:
    determining, based on the radius of the wafer, two notional circumferences around the two locations on the two peripheral edges of the wafer;
    determining an intersection of the two notional circumferences within a periphery of the wafer; and
    designating the determined intersection as the center of the wafer.

11. The system of claim 4, wherein the camera arrangement is provided in a vacuum-seal window within the wall of the wafer processing chamber.

12. A method for positioning a wafer relative to a datum structure, the method comprising:
    placing, adjacent a wafer processing chamber, a camera arrangement including at least two cameras, each of the at least two cameras including a field of view when positioned in the camera arrangement, each field of view including a peripheral edge of the wafer and a peripheral edge of the datum structure;
    receiving positional data from each of the at least two cameras,
    identifying a first point on an edge of the datum structure in a first field of view and a second point on an edge of the datum structure in a second field of view,
    determining a center of the datum structure based on the first and second points,
    determining, by a processor, in relation to each field of view, a gap size between the respective peripheral edges of the wafer and a datum location included in the respective field of view,
    identifying a first point on the peripheral edge of the wafer in the first field of view based on the first point on the edge of the datum structure and a first gap size, and a second point on the peripheral edge of the wafer in the second field of view based on the second point on the edge of the datum structure and a second gap size,
    determining a center of the wafer by circumscribing a first notional circumference around the first point on the peripheral edge of the wafer and a second notional circumference around the second point on the peripheral edge of the wafer, and identifying an intersection of the first and second notional circumferences within a periphery of the wafer as the center of the wafer, and determining, by the processor, an offset between a center of the datum structure and a center of the wafer; and adjusting, by a controller, a position of the wafer relative to the datum structure based on the determined respective gap sizes and the offset between the center of the datum structure and the center of the wafer.

13. The method of claim 12, wherein the datum location includes an edge ring.

14. The method of claim 12, wherein the datum location includes a chuck.

15. The method of claim 12, further comprising providing the camera arrangement in a wall of the wafer processing chamber.

16. The method of claim 12, farther comprising including a third camera in the camera arrangement, and providing positional data from the third camera, in relation to a respective third field of view, to the processor.

17. The method of claim 12, farther comprising comparing the determined respective gap sizes against respective predetermined gap sizes, the respective predetermined gap sizes associated with a centered or desired position of the wafer in relation to the datum structure or the wafer processing chamber.

18. The method of claim 12, further comprising including, in the controller, a robotic arm of a vacuum transfer module (VTM).

19. A system for positioning a wafer relative to a datum structure, the system comprising:

a camera arrangement including one or more cameras, each of the one or more cameras including a field of view when positioned in the camera arrangement, each field of view including a peripheral edge of the wafer and a peripheral edge of the datum structure;

a processor to:

receive positional data from each of the one or more cameras, identify a first point on an edge of the datum structure in a first field of view and a second point on an edge of the datum structure in a second field of view, determine a center of the datum structure based on the first and second points, determine, in relation to each field of view, a gap size between the respective peripheral edges of the wafer and a datum location included in the respective field of view, identify a first point on the peripheral edge of the wafer in the first field of view based on the first point on the edge of the datum structure and a first gap size, and a second point on the peripheral edge of the wafer in the second field of view based on the second point on the edge of the datum structure and a second gap size, determine a center of the wafer by circumscribing a first notional circumference around the first point on the peripheral edge of the wafer and a second notional circumference around the second point on the peripheral edge of the wafer, and identifying an intersection of the first and second notional circumferences within a periphery of the wafer as the center of the wafer, and determine an offset between a center of the datum structure and a center of the wafer; and a controller to adjust a position of the wafer relative to the datum structure based on the determined respective gap sizes and the offset between the center of the datum structure and the center of the wafer.

20. The system of claim 19, wherein the one or more cameras include a single movable camera.

21. The system of claim 20, wherein the single movable camera is mounted on a robotic arm.

22. The system of claim 21, wherein the robotic arm is mounted on a vacuum transfer module (VTM).

\* \* \* \* \*